(12) United States Patent
Okamoto et al.

(10) Patent No.: US 7,667,541 B2
(45) Date of Patent: Feb. 23, 2010

(54) AMPLIFIER CIRCUIT AND WIRELESS COMMUNICATION DEVICE

(75) Inventors: Naoki Okamoto, Osaka (JP); Hiroyuki Kohama, Nara (JP); Maki Shibata, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/109,596

(22) Filed: Apr. 25, 2008

(65) Prior Publication Data

US 2008/0265995 A1    Oct. 30, 2008

(30) Foreign Application Priority Data

Apr. 25, 2007    (JP) ............... 2007-115597

(51) Int. Cl.
*H03G 3/10* (2006.01)
(52) U.S. Cl. ......................... 330/278; 330/51
(58) Field of Classification Search ............. 330/51, 330/278, 279, 311
See application file for complete search history.

(56) References Cited

U.S. PATENT DOCUMENTS 5,999,056 A    12/1999    Fong 6,392,487 B1 *    5/2002    Alexanian ............ 330/254
6,801,089 B2 *    10/2004    Costa et al. ............ 330/278

FOREIGN PATENT DOCUMENTS

JP    2002-519920 A    7/2002

* cited by examiner

*Primary Examiner*—Khanh V Nguyen
(74) *Attorney, Agent, or Firm*—RatnerPrestia

(57) ABSTRACT

An amplifier circuit has a current conversion circuit that receives a high frequency signal and produces a signal current according to the high frequency signal; a gain control circuit that includes a control signal input for receiving a control signal, a first output, and a second output, and produces the signal current from the first output or the second output according to the control signal; an impedance circuit that includes a first node connected to the first output, a second node connected to the second output, and a third node, the impedance circuit presenting a predetermined impedance between the nodes; a switch circuit that is inserted between the first output and the first node; and a load impedance unit that is connected to the first output and produces a gain signal representing an amplified high frequency signal.

11 Claims, 11 Drawing Sheets

AMPLIFIER CIRCUIT AND WIRELESS COMMUNICATION DEVICE

BACKGROUND OF THE INVENTION

1. Field of Invention

The present invention relates to technology for an amplifier circuit used in the receiver of a wireless communication device such as a cell phone or PHS phone, and relates more particularly to an amplifier circuit and a wireless communication device.

2. Description of Related Art

A variable gain amplifier according to the prior art is shown in FIG. 11. In FIG. 11 a high frequency signal S201 is input to a current conversion circuit 200 through an input node 201. The high frequency signal S201 is input to the base of a transistor 203, and a signal current I202 corresponding to the high frequency signal S201 is then output through the collector of the transistor 203 from the output node 202 of the current conversion circuit 200.

The signal current I202 is then input to a gain control circuit 204 connected in common to the output node 202. The gain control circuit 204 consists of transistors 205 and 206 having the emitters connected in common. The gain control circuit 204 selectively outputs the signal current I202 to the collectors 230, 231 of the transistors 205 and 206, respectively, based on the voltage S207, S208 applied to the bases 207, 208 of the transistors 205 and 206.

The collector 231 of transistor 206 is connected to the main load impedance 215 of the amplifier circuit and to node 210 of the impedance circuit 209, and outputs gain signal S231. The collector 230 of transistor 205 is connected to node 211 of the impedance circuit 209, and outputs gain signal S230.

The impedance circuit 209 has three nodes, node 210, node 211, and a power supply node 290 connected to the power supply. An impedance device 212 with a prescribed impedance is connected between node 210 and node 211, and another impedance device 213 with a prescribed impedance is connected between node 211 and the power supply node 290. The impedance between node 210 and the power supply node 290 is greater than the impedance between node 211 and the power supply node 290 by the impedance of impedance device 212. The load circuit 214 is electrically coupled through matching device 216 to the output pin 217 for impedance matching with the output pin 217.

In the high gain mode the base voltage S208 of the transistor 206 is set high relative to the base voltage S207 of transistor 205 so that transistor 205 is off and transistor 206 is on. All of signal current I202 is converted at this time to the signal current I231 flowing to the collector 231 of transistor 206. The total load of this signal current I231 is determined by the parallel connection of load impedance 215 with the impedance of the impedance circuit 209 measured from node 210. The signal current I231 is converted to the gain signal S231 at collector 231 by the impedance of the total load thus determined, and is output through matching device 216 to the output pin 217 as the output signal S217.

The gain signal S231 can be expressed in terms of the signal current I231, the impedance R212 and R213 of impedance devices 212 and 213, and the impedance Z215 of load impedance 215 as follows where $A//B = A*B/(A+B)$.

$$S231 = I206 * (Z215 // (R212 + R213))$$
$$= I231 * Z215 * (R212 + R213) / (Z215 + R212 + R213)$$

In the low gain mode the base voltage S207 of transistor 205 is set higher than the base voltage S208 of transistor 206 so that transistor 206 is off and transistor 205 is on. The signal current I202 is converted to the signal current I230 flowing to the collector 230 of the transistor 205. The total load of this signal current I230 is determined by the parallel connection of impedance device 213 with the serially connected load impedance 215 and impedance device 212. The signal current I230 is converted to the gain signal S230 at collector 230 by the impedance of the total load thus determined, and is output through impedance device 212 and matching device 216 to the output pin 217 as the output signal S217.

The gain signal S230 can be expressed as follows using the signal current I230, impedances R212 and R213, and impedance Z215.

$$S230 = I230 * ((Z215 + R212) // R213)) * Z215 / (R212 + Z215)$$
$$= I230 * Z215 * R213 / (Z215 + R212 + R213)$$

If the characteristics of transistors 205 and 206 are the same, signal current I230 and signal current I231 will be equal, and the relationship between gain signal S230 and gain signal S231 will be as follows.

$$S230 = S231 * R213 / (R212 + R213)$$

In other words, the gain signal S230 in the low gain mode is determined by the impedance ratio between impedances R212 and R213.

See, for example, U.S. Pat. No. 5,999,056 (corresponding to Japanese Laid-open Patent Publication No. 2005-519920).

A first problem with the prior art described above is that gain drops in the high gain mode. Conventionally, the amplifier load is preferably determined only by the main load impedance 215, but the total load impedance is reduced by connecting impedance circuit 209 in parallel, and gain therefore drops in the high gain mode. An arrangement that increases current consumption could be used to compensate for this drop, but increasing the current consumption must be avoided in portable devices that are powered by a battery.

A second problem with the prior art is that is a drop in the distortion characteristic of the low gain mode apparent at the third order input intercept point (IIP3) or the 1-dB compression point (P1 dB). This is because the voltage S230 at node 211 of the impedance circuit 209 drops, and the collector-emitter voltage of transistor 205 drops with the dc current flow to the amplifier circuit.

One way to solve the first problem is to increase the total impedance of the impedance circuit 209 and suppress the impedance loss from the parallel connection of the load impedance 215, but this has the side effect of lowering the voltage S230 at node 211 of the impedance circuit 209 and degrading the distortion characteristic.

Another potential solution is to lower the impedance of the impedance device 213 to a level that the voltage drop of the node 211 can be ignored, and increase the impedance of the impedance device 212 to increase the total impedance of the impedance circuit 209. In this case, however, the ratio (R213/(R212+R213)) of the impedance devices 212 and 213 cannot be set above a constant value, and the gain of the low gain mode therefore cannot be set as desired.

One way to solve the second problem is to lower the total impedance of the impedance circuit 209, but this has the side effect of lowering the gain of the high gain mode. This also conflicts with the solution to the first problem.

Solutions to the foregoing first and second problems are thus a trade-off, and cannot be simultaneously solved.

SUMMARY OF THE INVENTION

An object of the present invention is to simultaneously enable preventing gain loss in the high gain mode, improving the distortion characteristic in the low gain mode, and setting the desired gain.

An amplifier circuit according to the present invention enables preventing a drop in gain in the high gain mode, improving the distortion characteristic in the low gain mode, and setting the desired gain by parallel connecting the main load impedance and the impedance circuit that attenuates the gain so that the load in the low gain mode is the impedance of the parallel connection and the load in the high gain mode is electrically isolated from the parallel connected impedance circuit and is the impedance of the main load impedance.

More specifically, an amplifier circuit according to a first aspect of the invention has a current conversion circuit that receives a high frequency signal and produces a signal current according to the high frequency signal; a gain control circuit that includes a control signal input for receiving a control signal, a first output, and a second output, and produces the signal current from the first output or the second output according to the control signal; an impedance circuit that includes a first node connected to the first output, a second node connected to the second output, and a third node, the impedance circuit presenting a predetermined impedance between the nodes; a switch circuit that is inserted between the first output and the first node; and a load impedance unit that is connected to the first output and produces a gain signal representing an amplified high frequency signal. The amplifier circuit changes a level of the gain signal according to the control signal.

Another aspect of the invention is a wireless communication device that uses the amplifier circuit of the invention.

The amplifier circuit and wireless communication device of the invention can increase gain without increasing current consumption in the high gain mode. In the low gain mode, a drop in the distortion characteristic can be reduced without reducing the dc voltage drop. More specifically, low power consumption, a low distortion characteristic, and a low noise characteristic can be achieved simultaneously. A common matching circuit can also be used because variation in the input/output impedance can be minimized when switching between the high gain mode and low gain mode.

Other objects and attainments together with a fuller understanding of the invention will become apparent and appreciated by referring to the following description and claims taken in conjunction with the accompanying drawings.

DETAILED DESCRIPTION OF THE PREFERRED EMBODIMENTS

Figure 1:
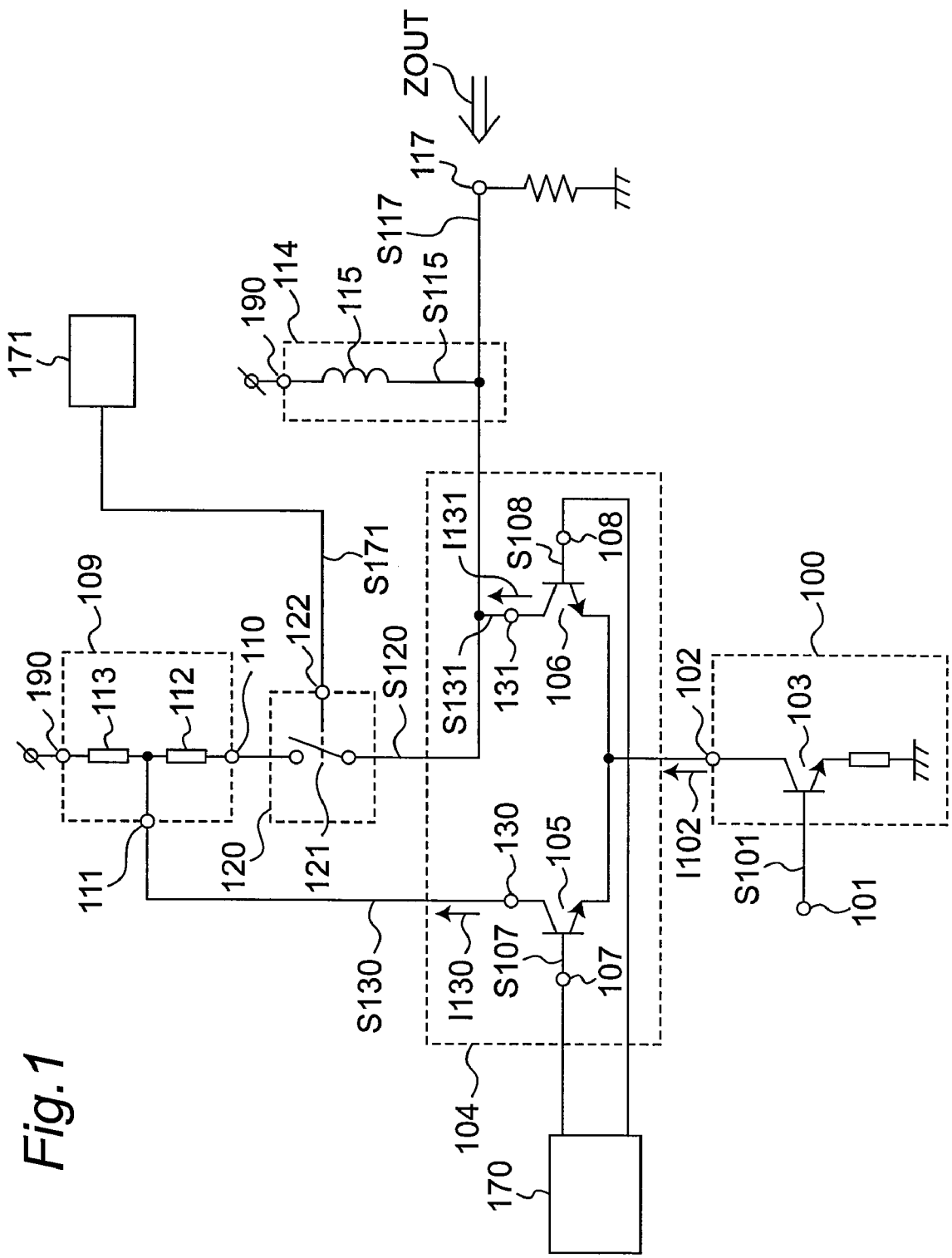
FIG. 1 is a circuit diagram of the amplifier circuit in a first embodiment of the invention.

Preferred embodiments of the present invention are described below with reference to the accompanying figures. Note that parts that are functionally the same as parts that have already been described are identified by the same reference numerals, and further description thereof is omitted.

Preferred embodiments of the present invention are described below with reference to the accompanying figures. Note that parts with the same arrangement, operation, and effect are denoted by the same reference numerals in the accompanying figures. The numbers used below and in the figures are also merely to describe a specific embodiment of the invention, and the invention is not limited to the cited numbers. In addition, logic levels denoted high and low are also only used by way of example to describe a specific embodiment of the invention, and it will be obvious that the same effect can be achieved using different combinations of the exemplary logic levels. Furthermore, the connections between particular parts described below are also used to describe a specific embodiment of the invention, and the connections achieving the function of the invention are not limited to those described below. The following embodiments are also rendered using hardware and/or software elements, but the hardware arrangements described below can also be achieved using software, and the software constructions described below can also be achieved using hardware.

Embodiment 1

FIG. 1 is a circuit diagram of an amplifier circuit according to a first embodiment of the invention. As shown in FIG. 1 a high frequency signal S101 to be amplified is input to a current conversion circuit 100 through an input pin 101. The high frequency signal S101 is received at the base of a grounded-emitter transistor 103, and a signal current I102 corresponding to the high frequency signal S101 is then output through the collector of the transistor 103 from the output node 102 of the current conversion circuit 100.

The signal current I102 is then input to a gain control circuit 104 connected in common to the output node 102. The gain control circuit 104 consists of transistors 105 and 106 having the emitters connected in common. The gain control circuit 104 selectively outputs the signal current I102 to the collectors 130, 131 of the transistors 105 and 106, respectively, based on the control signals S107, S108 from a control signal generating circuit 170 applied to the bases 107, 108 of the transistors 105 and 106. The collectors 130, 131 are also referred to as the output pins 130, 131.

The collector 131 of transistor 106 is connected to the main load impedance 115 of the amplifier circuit, to switch circuit 120, and to output pin 117, and produces gain signal S131. The switch circuit 120 turns on and off according to the control signal S171 from a control signal generating circuit 171. The other side of the switch circuit 120 is connected to node 110 of the impedance circuit 109. The collector 130 of transistor 105 is connected to node 111 of the impedance circuit 109, and produces gain signal S130.

The impedance circuit 109 has three nodes, node 110, node 111, and a power supply node 190 connected to the power supply. An impedance device 112 with a predetermined impedance is connected between node 110 and node 111, and another impedance device 113 with a predetermined impedance is connected between node 111 and the power supply node 190. The impedance between node 110 and the power supply node 190 is greater than the impedance between node 111 and the power supply node 190 by the impedance of impedance device 112.

Operation of the high gain mode and the low gain mode are described next.

In the high gain mode control signal S108 is set high relative to control signal S107 so that transistor 105 is off and transistor 106 is on. All of signal current I102 is converted at this time to the signal current I131 flowing to the collector 131 of gain control circuit 104. The switch circuit 120 is turned off by the control signal S171, and the collector 131 of the gain control circuit 104 and node 110 of impedance circuit 109 are electrically isolated.

Signal current I102 is also input to the load impedance 115, and appears as gain signal S131 at the collector 131. The gain signal S131 is output from the output pin 117 as the output signal S117. If the output signal S117 in the high gain mode is output signal S117H, this output signal S117H can be expressed as follows in terms of the signal current I102 of the current conversion circuit 100 and the impedance Z115 of the load impedance 115.

$$S117H = I102 * Z115 \quad (1)$$

In the low gain mode the control signal S107 is set higher than control signal S108 so that transistor 106 is off and transistor 105 is on. The signal current I102 is converted to the signal current I130 flowing to the collector 130 of the gain control circuit 104. The signal current I130 is input to node 111 of impedance circuit 109. The control signal S171 causes the switch circuit 120 to turn on this time, and the collector 131 of the gain control circuit 104 and node 110 of the impedance circuit 109 are electrically isolated.

The total load of this signal current I130 is determined by the serially connected impedance of the impedance Z112 of impedance device 112, the on resistance Z121 of the 121 included in the switch circuit 120, and impedance Z115, and the parallel connected impedance Z113 of impedance device 113. The signal current I130 is converted to the gain signal S130 by the impedance of this total load. The gain signal S130 is output through impedance device 112 and switch circuit 120 as the output signal S117 from the output pin 117.

If the output signal S117 in the low gain mode is output signal S117L, output signal S117L can be expressed as follows (where $A//B=(A*B)/(A+B)$).

$$S117L = I102 * (Z113 // (Z112 + Z121 + Z115)) * \quad (2)$$
$$Z115 / (Z112 + Z121 + Z115)$$
$$= I102 * Z115 * Z113 / (Z113 + Z112 + Z121 + Z115)$$

Output signal S117L is attenuated from the output signal S117H by the amount ATT as follows.

$$ATT = Z113/(Z113 + Z112 + Z121 + Z115) \quad (3)$$

It is important to note that the output signal S117H is determined only by impedance Z115 in the high gain mode, and is not affected by impedances Z112 and Z113. Maximum gain can therefore be achieved in the high gain mode, and an amplifier circuit that outputs the desired gain with the least current can be achieved. The gain of the low gain mode can be set freely without considering a drop in the gain of the high gain mode by varying the impedances Z112 and Z113. Furthermore, because the impedance Z113 can be set low even if the dc operating current of the amplifier circuit in the low gain mode flows to node 111 of the impedance circuit 109, the voltage drop at the node 111 can be reduced and a drop in the distortion characteristic can be minimized.

Embodiment 2

A second embodiment of the invention is described next focusing on the differences with the first embodiment. Other aspects of the arrangement, operation, and effect of the second embodiment are the same as in the first embodiment, and further description thereof is omitted below.

Figure 2:
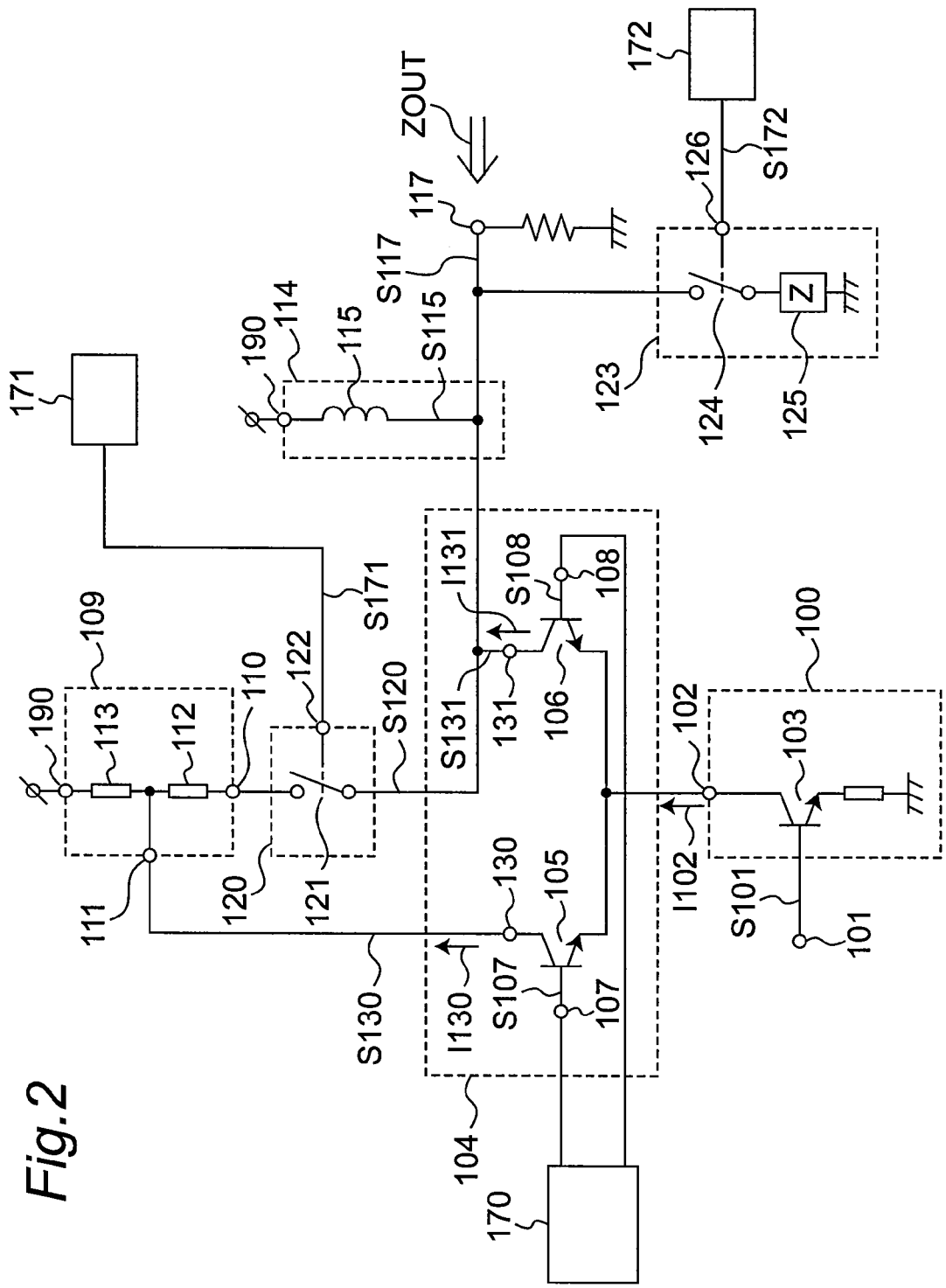
FIG. 2 is a circuit diagram of the amplifier circuit in a second embodiment of the invention.

FIG. 2 is a circuit diagram of an amplifier circuit according to a second embodiment of the invention. Compared with the amplifier circuit of the first embodiment, this embodiment additionally has a variable impedance circuit 123 connected between the collector 131 of the gain control circuit 104 and the output pin 117.

The variable impedance circuit 123 has an impedance device 125 with a predetermined impedance, and a switch 124 that turns on/off electrically based on a control signal S172 applied from a control signal generating circuit 172.

In general, high frequency signals used for wireless communication have an extremely short wavelength, and some measures of reducing signal loss from reflection is required when the signals are processed by an internal circuit board. The impedance of the signal line is therefore matched to a predetermined impedance. The matching circuit is generally composed of passive devices such as inductors and capacitors, and the same circuit is used in both the high gain mode and low gain mode. As a result, variation in the input/output impedance when the gain mode of the amplifier circuit is changed must be suppressed to within a limited range. In the arrangement shown in FIG. 2 the output impedance ZOUT of the amplifier circuit of the second embodiment at the output pin 117 must be prevented from varying when the gain mode changes.

Figure 3:
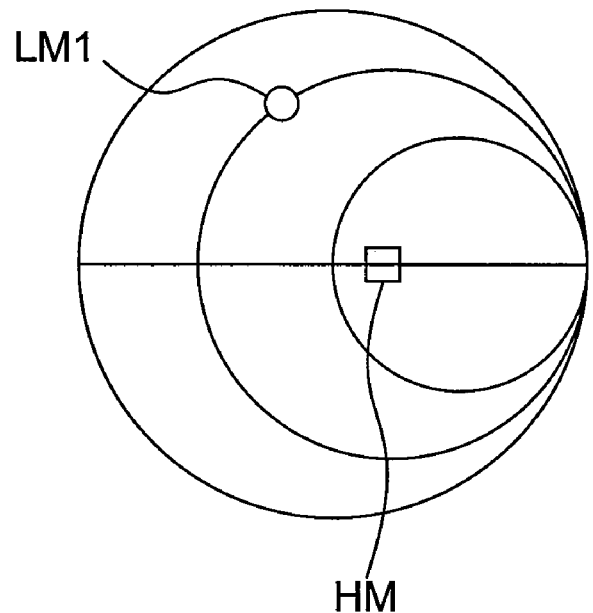
FIG. 3 describes the operation of an amplifier circuit according to the first embodiment of the invention.

FIG. 3 is a Smith chart showing examples of the output impedance ZOUT in the high gain mode HM and low gain mode LM1. In the first embodiment of the invention the output impedance ZOUT at the output pin 117 will vary in FIG. 3 in the high gain mode HM and low gain mode LM1 depending upon the impedance Z112 and Z113 of the impedance devices 112 and 113.

Figure 4:
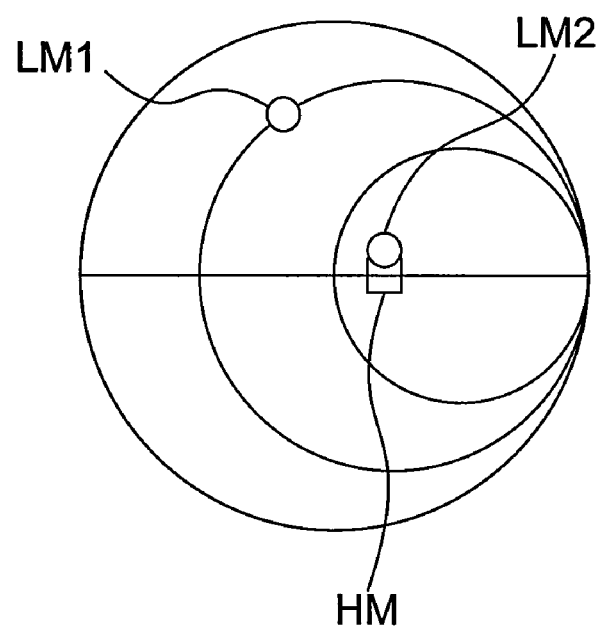
FIG. 4 describes the operation of an amplifier circuit according to the second embodiment of the invention.

In this case the control signal 126 is set in the low gain mode LM1 so that the switch 124 turns on, and so that the switch 124 turns off in the high gain mode HM. A capacitor is used for the impedance device 125 and the capacitance is set appropriately so that the output impedance ZOUT in the low gain mode LM2 varies as shown in FIG. 4 and approaches the output impedance ZOUT in the high gain mode HM. This holds variation in the output impedance ZOUT at the output pin 117 to within a predetermined range even when the gain mode changes, and enables impedance matching regardless of whether a common matching circuit is used in both gain modes.

The output impedance ZOUT in the high gain mode and the low gain mode is shown by way of example only in the second embodiment, and the output impedance ZOUT can be set as desired using impedances Z112 and Z113 and impedance Z115. The variable impedance circuit 123 can therefore operate in both the low gain mode and the high gain mode.

Figure 5:
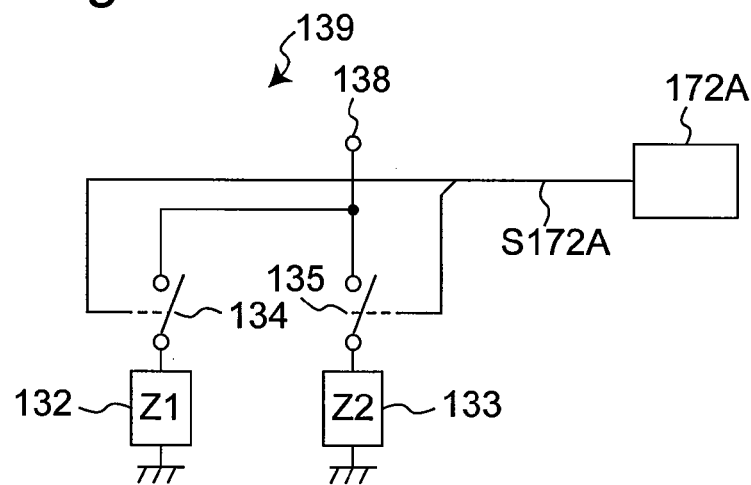
FIG. 5 is a circuit diagram of the impedance varying circuit of the amplifier circuit according to the second embodiment of the invention.
Figure 6A:
FIG. 6A is a circuit diagram of an impedance device of the amplifier circuit in the second embodiment of the invention.
Figure 6B:
FIG. 6B is a circuit diagram of an impedance device of the amplifier circuit in the second embodiment of the invention.
Figure 6C:
FIG. 6C is a circuit diagram of an impedance device of the amplifier circuit in the second embodiment of the invention.
Figure 6D:
FIG. 6D is a circuit diagram of an impedance device of the amplifier circuit in the second embodiment of the invention.
Figure 6E:
FIG. 6E is a circuit diagram of an impedance device of the amplifier circuit in the second embodiment of the invention.
Figure 6F:
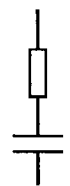
FIG. 6F is a circuit diagram of an impedance device of the amplifier circuit in the second embodiment of the invention.
Figure 6G:
FIG. 6G is a circuit diagram of an impedance device of the amplifier circuit in the second embodiment of the invention.
Figure 6H:
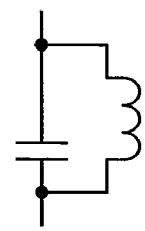
FIG. 6H is a circuit diagram of an impedance device of the amplifier circuit in the second embodiment of the invention.
Figure 6I:
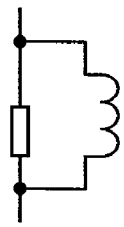
FIG. 6I is a circuit diagram of an impedance device of the amplifier circuit in the second embodiment of the invention.
Figure 6J:
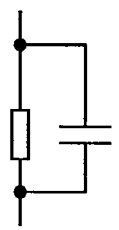
FIG. 6J is a circuit diagram of an impedance device of the amplifier circuit in the second embodiment of the invention.
Figure 6K:
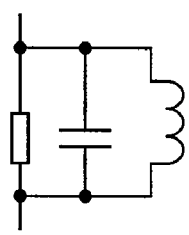
FIG. 6K is a circuit diagram of an impedance device of the amplifier circuit in the second embodiment of the invention.

As shown in FIG. 5, the variable impedance circuit 123 can be replaced by a variable impedance circuit 139 having impedance devices 132 and 133. In the high gain mode a control signal S172A from a control signal generating circuit 172A turns a switch 134 on and another switch 135 off so that impedance device 132 operates. In the low gain mode, switch 134 turns off and 135 turns on so that impedance device 133 operates.

As shown in FIG. 6A to FIG. 6K, the impedance devices 125, 132, and 133 can be rendered using various combinations of passive devices such as resistors, inductors, and capacitors connected in series or parallel. Further alternatively, combinations not shown in the figures can also be used. The switches 124, 134, 135 can also be disposed between or at the ground side of impedance devices 125, 132, and 133.

Figure 7:
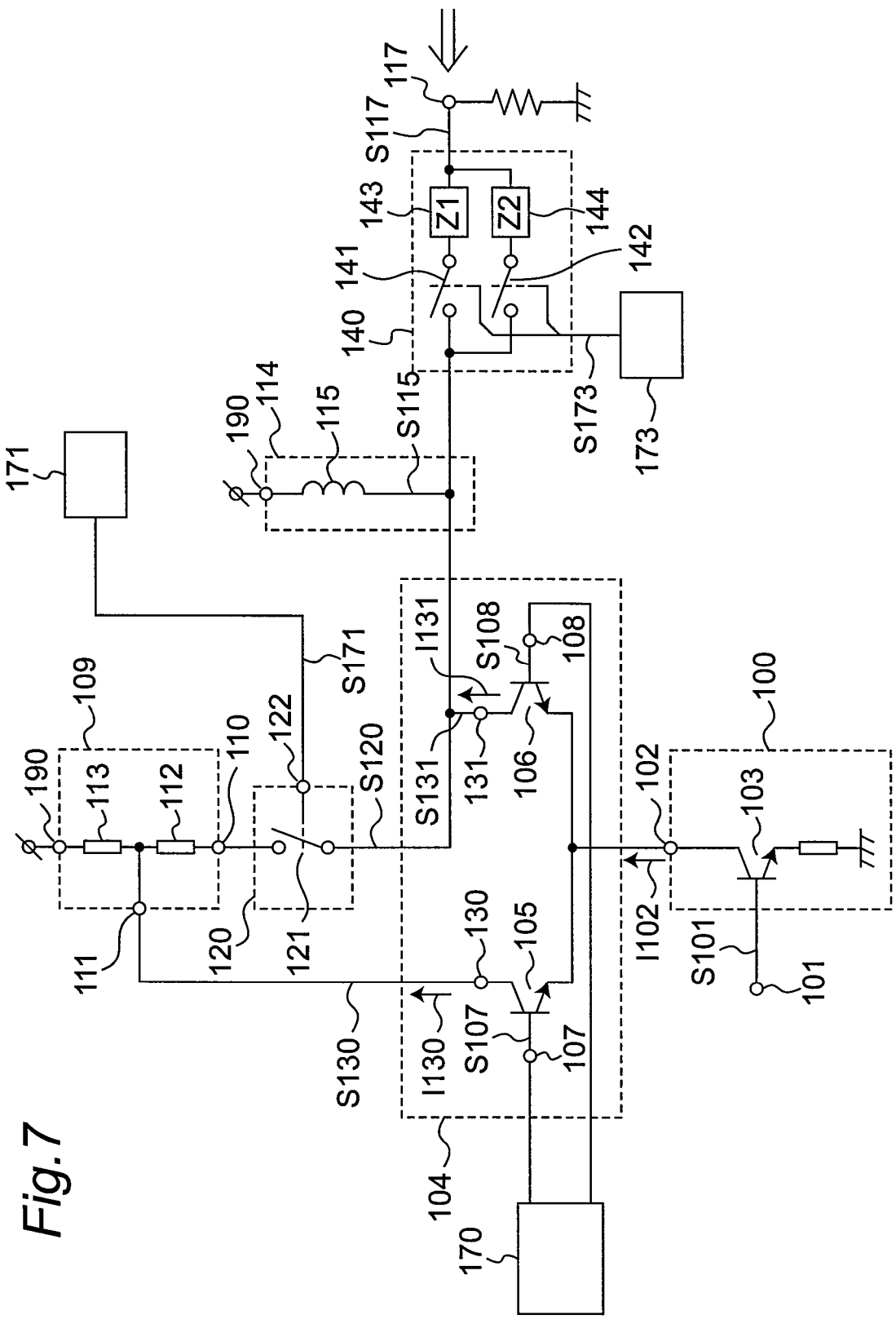
FIG. 7 is a circuit diagram of the amplifier circuit according to a second embodiment of the invention.

As shown in FIG. 7, a variable impedance circuit 140 could be inserted in series between the collector 131 of the gain control circuit 104 and the output pin 117. The variable impedance circuit 140 has a switch 141 and an impedance device 143 with a predetermined impedance connected in series parallel connected to another switch 142 connected in series to an impedance device 143 with a predetermined impedance. The switch 141 turns on in the high gain mode and off in the low gain mode according to a control signal S173 applied from a control signal generating circuit 173. Switch 142 turns off in the high gain mode and on in the low gain mode according to the control signal 173.

If the switch 141 is held constantly on for impedance matching, switch 141 can be omitted, and if switch 142 is held constantly on for impedance matching, switch 142 can be omitted. The impedance device 143, 144 can also be rendered as shown in FIG. 6A to FIG. 6K, the impedance devices 125, 132, and 133 can be rendered using various combinations of passive devices such as resistors, inductors, and capacitors connected in series or parallel. Further alternatively, combinations not shown in the figures can also be used. The switches 141, 142 can also be disposed between impedance devices 143, 144 or on the output pin 117 side.

Figure 8:
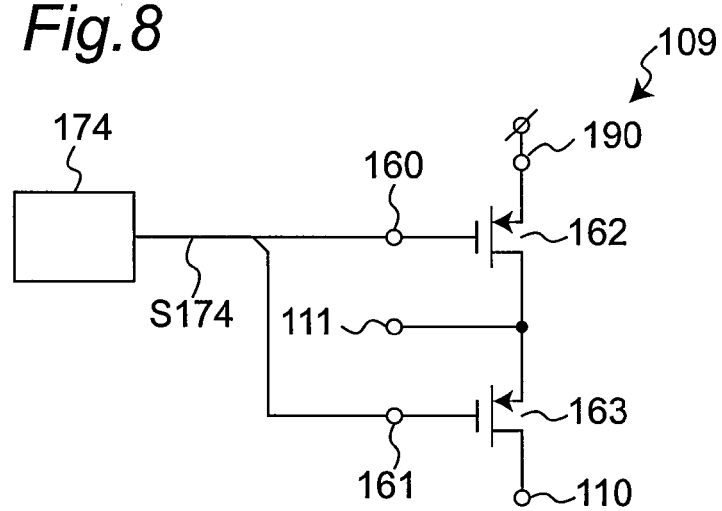
FIG. 8 is a circuit diagram showing an example of the impedance circuit in an amplifier circuit according to a second embodiment of the invention.
Figure 9A:
FIG. 9A is a circuit diagram of an impedance device of the amplifier circuit in the second embodiment of the invention.
Figure 9B:
FIG. 9B is a circuit diagram of an impedance device of the amplifier circuit in the second embodiment of the invention.
Figure 9C:
FIG. 9C is a circuit diagram of an impedance device of the amplifier circuit in the second embodiment of the invention.
Figure 9D:
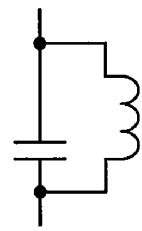
FIG. 9D is a circuit diagram of an impedance device of the amplifier circuit in the second embodiment of the invention.
Figure 9E:
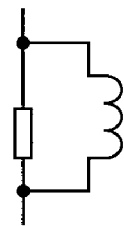
FIG. 9E is a circuit diagram of an impedance device of the amplifier circuit in the second embodiment of the invention.
Figure 9F:
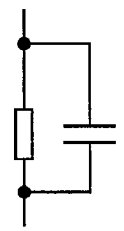
FIG. 9F is a circuit diagram of an impedance device of the amplifier circuit in the second embodiment of the invention.
Figure 9G:
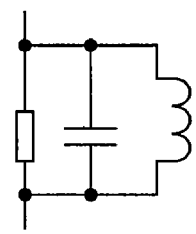
FIG. 9G is a circuit diagram of an impedance device of the amplifier circuit in the second embodiment of the invention.

Further alternatively, the impedance circuit 109 can be rendered as shown in FIG. 8. The drain of a MOS transistor 163 is connected to the node 110 of impedance circuit 109, and node 111 is connected to the source of the MOS transistor 163. The control signal S174 applied from a control signal generating circuit 174 is applied to the gate 161 of the MOS transistor 163.

The drain of another MOS transistor 162 is connected to the node 111 of the impedance circuit 109, and the power supply node 190 is connected to the source of the MOS transistor. The control signal S174 is applied to the gate 160 of the MOS transistor 162.

The impedance circuit 109 shown in FIG. 8 divides the gain signals S130 and S131 by the on resistance of MOS transistors 162 and 163 to output the output signal S117 to the output pin 117.

As described above, the output signal S117L in the low gain mode is described by equation 2. In equation 2 the impedance Z121 is the on resistance of the switch 121 rendered by a MOS transistor. The impedances Z112, Z113 can be rendered by inductors or other passive devices. If the sum of impedances Z112 and Z113 is set low enough that impedance Z121 cannot be ignored, variations during the semiconductor production process will be a problem. Because this variation appears between the impedance of the passive device and the resistance of the MOS transistor, the relative variation between this impedance and the on resistance increases, and the absolute variation in the output signal S117 increases. By rendering the impedances Z112 and Z113 using the on resistance of MOS transistors in the same way as impedance Z121, the absolute value of the output signal S117 is resistant to manufacturing variations and quality can be improved.

The control signal S174 can be set so that MOS transistors 162 and 163 are always on. The control signal S174 can also be set so that MOS transistors 162 and 163 are on only in the low gain mode.

The impedance devices 112, 113 can be rendered using various combinations of passive devices such as resistors, inductors, and capacitors connected in series or parallel as shown in FIG. 9A to FIG. 9G.

Embodiment 3

A third embodiment of the invention is described next focusing on the differences with the first and second embodiments. Other aspects of the arrangement, operation, and effect of the third embodiment are the same as in the first and second embodiments, and further description thereof is omitted below.

Figure 10:
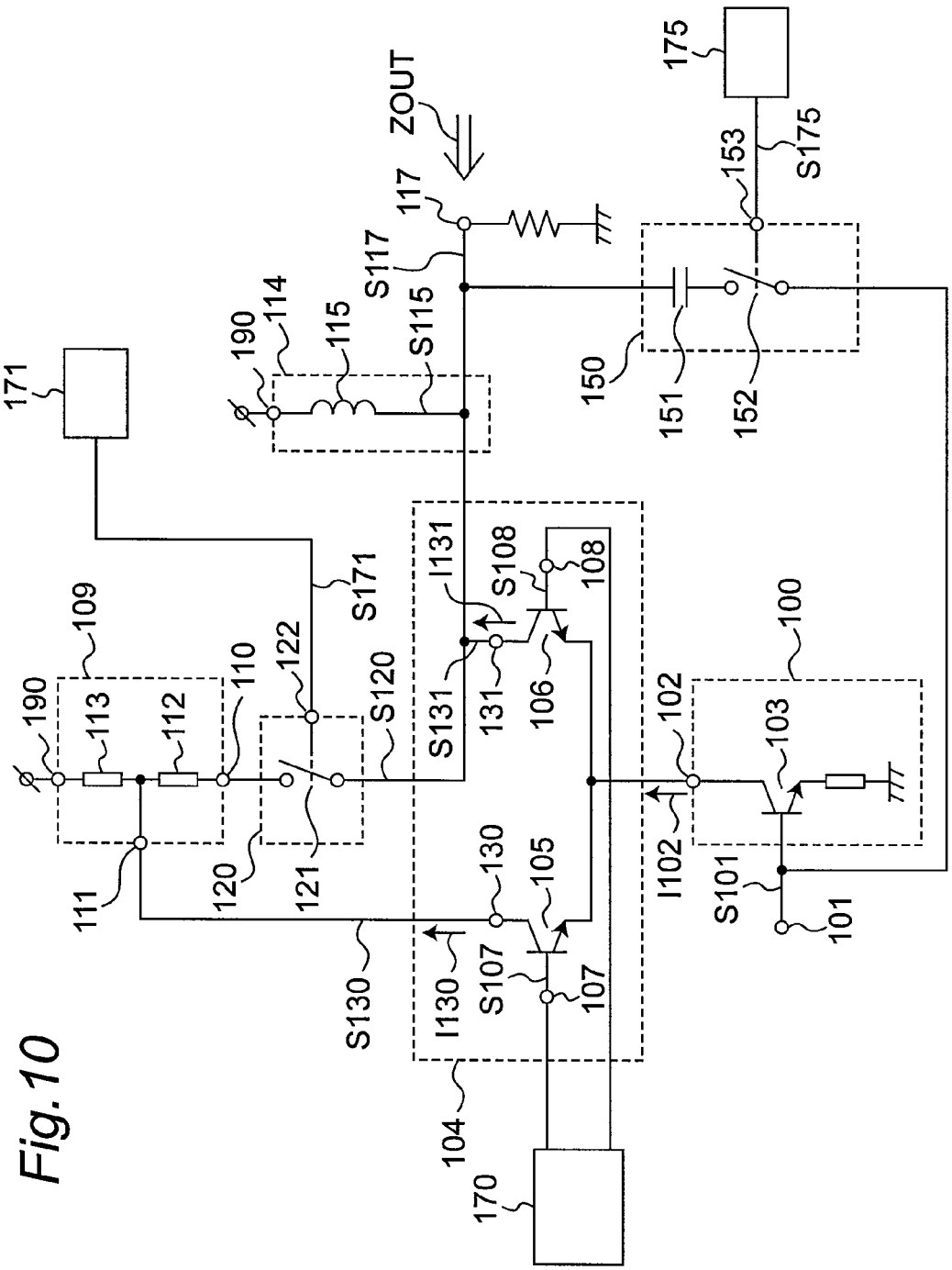
FIG. 10 is a circuit diagram of the amplifier circuit according to a third embodiment of the invention.
Figure 11:
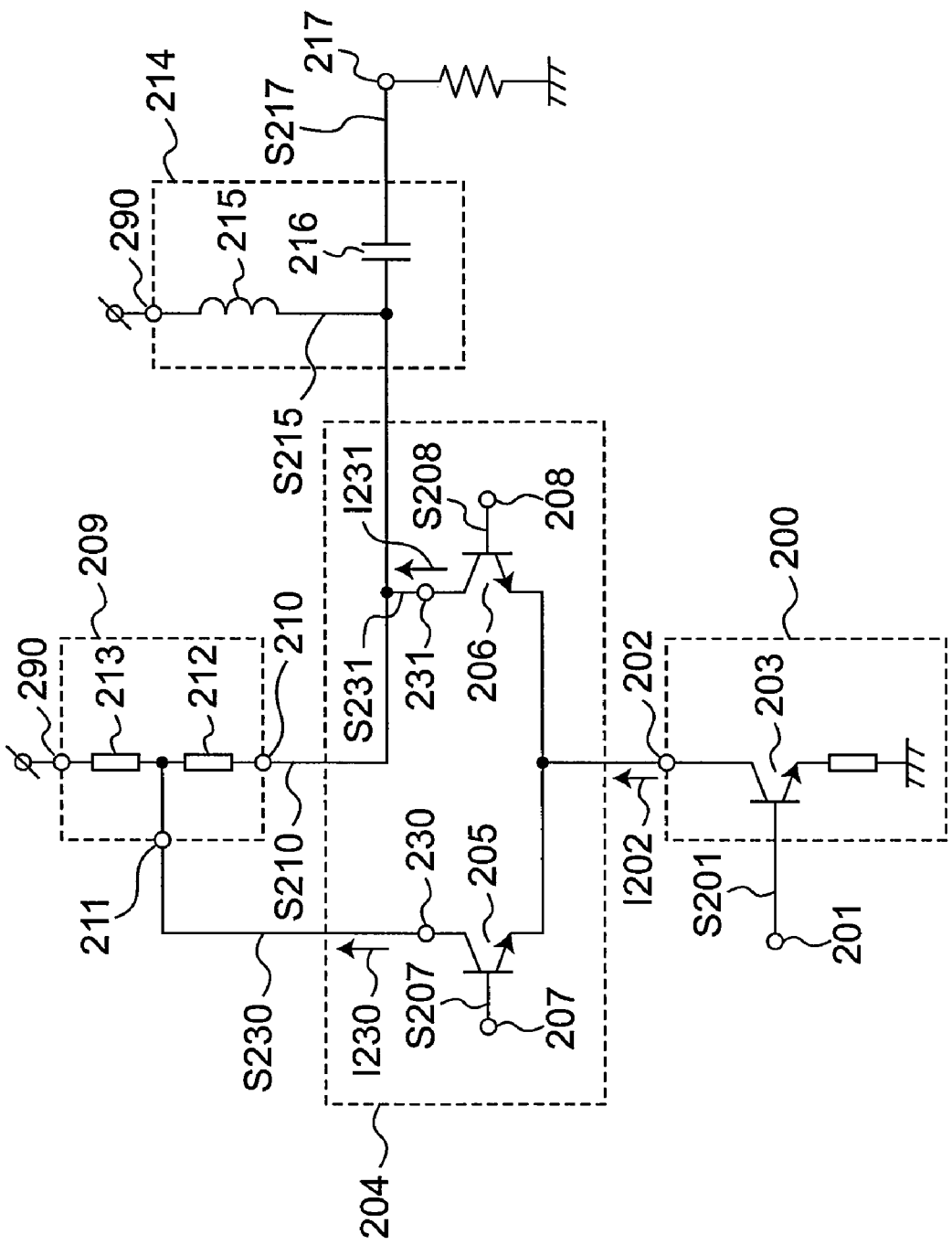
FIG. 11 is a circuit diagram of the amplifier circuit according to the prior art.

FIG. 10 is a circuit diagram of an amplifier circuit according to a third embodiment of the invention. Compared with the amplifier circuit of the first embodiment, this embodiment additionally has a bypass circuit 150 inserted between the input pin 101 and output pin 117. The bypass circuit 150 has a switch 152 that switches on/off according to the control signal S175 input from the control signal generating circuit 175, and a capacitor 151 used to cut the dc voltage from the input pin 101.

Wireless communication devices are designed to be carried around freely and at times are used near the communication base station. Because signals significantly exceeding the limited dynamic range of the reception circuit are input when near the base station, the amplifier circuit located at the first stage of the reception circuit has a gain mode with gain less than 1 to prevent a drop in reception performance due to reception circuit saturation. Because gain is not necessary, the bypass circuit 150 in the amplifier circuit of this third embodiment of the invention attenuates the input signal S101, passes the input signal to the output pin 117, and stops the dc current flowing to the amplifier circuit, thereby reducing current consumption. This embodiment of the invention thus has three gain modes, a high gain mode, low gain mode, and attenuation mode, sets the control signal S175 to turn the bypass circuit 150 on in the attenuation mode, attenuate and output the input signal S101 to the output pin 117, and thereby reduce current consumption.

The effects of the invention are summarized below.

Without incurring undesirable side effects, a first aspect of the invention described above enables reducing current consumption in the high gain mode while also enabling setting the gain of the low gain mode as desired without lowering the gain in the high gain mode and also preventing a drop in the distortion characteristic.

Irrespective of the impedance of the impedance device that operates in the low gain mode, the second aspect of the invention suppresses variation in the output impedance ZOUT when switching between the high gain mode and low gain mode to within a predetermined range, and thus enables a common matching circuit in both gain modes.

The third aspect of the invention can hold gain variation in the low gain mode caused by manufacturing variations in the semiconductor production process to a low level, and thus improves quality.

The fourth aspect of the invention has three gain modes, and greatly reduces current consumption by causing a bypass circuit disposed between the input and output of the amplifier circuit to operate when operating in the gain mode with gain less than 1.

The fifth aspect of the invention anticipates applying the invention to a reception system that requires a plurality of gain modes.

As described above, gain can be increased in the high gain mode without increasing current consumption. A drop in the distortion characteristic can also be suppressed in the low gain mode because the drop in the dc voltage can be reduced. More specifically, low power consumption, a low distortion characteristic, and a low noise characteristic can be simultaneously achieved. In addition, a common matching circuit can be used in the high gain mode and low gain mode because variation in the output impedance is low.

A phase locked loop (PLL), or cell phone or other wireless communication device, that uses the amplifier circuit according to the first embodiment of the invention can use the effects of the above-described amplifier circuit to contribute to the high performance of the PLL and wireless communication device.

The transistors 103, 105, 106 and the switches 121, 124, 134, 135, 141, 142, 152 described above can be rendered using bipolar transistors, silicon-germanium transistors, MOS (metal oxide semiconductor) transistors, insulated gate bipolar transistors (IGBT), or any other type of signal amplifying and switching device.

The present invention can be used in amplifier circuits and wireless communication devices.

The invention being thus described, it will be obvious that it may be varied in many ways. Such variations are not to be regarded as a departure from the spirit and scope of the invention, and all such modifications as would be obvious to one skilled in the art are intended to be included within the scope of the following claims.

What is claimed is:

1. An amplifier circuit comprising:
   a current conversion circuit that receives a high frequency signal and produces a signal current according to the high frequency signal;
   a gain control circuit that includes a control signal input for receiving a control signal, a first output, and a second output, and produces the signal current from said first output or said second output according to the control signal;
   an impedance circuit that includes a first node connected to said first output, a second node connected to said second output, and a third node, said impedance circuit presenting a predetermined impedance between said nodes;
   a switch circuit that is inserted between said first output and said first node; and
   a load impedance unit that is connected to said first output and produces a gain signal representing an amplified high frequency signal, wherein the amplifier circuit changes a level of the gain signal according to the control signal.

2. The amplifier circuit described in claim 1, wherein said switch circuit is switched off when said gain control circuit produces the signal current from said first output, and is switched on when said gain control circuit produces the signal current from said second output.

3. The amplifier circuit described in claim 1, wherein said third node is connected to a power supply supplying a power to said gain control circuit.

4. The amplifier circuit described in claim 1, further comprising a variable impedance circuit connected to said first output.

5. The amplifier circuit described in claim 4, wherein said variable impedance circuit includes an impedance device and a switch, and wherein said impedance device has a predetermined impedance and is serially connected to said switch.

6. The amplifier circuit described in claim 5, wherein said impedance device includes at least one of a resistor, a capacitor, and an inductor.

7. The amplifier circuit described in claim 1, wherein:
   said impedance circuit includes a first transistor and a second transistor;
   said first transistor is inserted between said first node and said second node; and
   said second transistor is inserted between said second node and said third node.

8. The amplifier circuit described in claim 7, wherein each of said first transistor and said second transistor is a metal oxide semiconductor transistor.

9. The amplifier circuit described in claim 1, wherein said current conversion circuit includes a high frequency signal input for receiving the high frequency signal, and wherein the amplifier circuit further comprising a switch inserted between said high frequency signal input and said first output.

10. The amplifier circuit described in claim 9, wherein said switch is switched on when the gain signal is smaller than the high frequency signal.

11. A wireless communication device comprising the amplifier circuit described in claim 1.

* * * * *